(12) United States Patent
Yang et al.

(10) Patent No.: US 10,446,741 B2
(45) Date of Patent: Oct. 15, 2019

(54) MULTIPLE HARD MASK PATTERNING TO FABRICATE 20NM AND BELOW MRAM DEVICES

(71) Applicant: Taiwan Semiconductor Manufacturing Company, Ltd., Hsinchu (TW)

(72) Inventors: Yi Yang, Fremont, CA (US); Yu-Jen Wang, San Jose, CA (US); Jesmin Haq, Milpitas, CA (US); Tom Zhong, Saratoga, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 65 days.

(21) Appl. No.: 15/790,649

(22) Filed: Oct. 23, 2017

(65) Prior Publication Data
US 2019/0123267 A1 Apr. 25, 2019

(51) Int. Cl.
*H01L 43/08* (2006.01)
*H01L 43/12* (2006.01)
*H01L 21/033* (2006.01)
*H01F 41/30* (2006.01)

(52) U.S. Cl.
CPC ........... *H01L 43/12* (2013.01); *H01F 41/302* (2013.01); *H01L 21/0332* (2013.01); *H01L 21/0335* (2013.01); *H01L 21/0337* (2013.01); *H01L 21/0338* (2013.01); *H01L 43/08* (2013.01)

(58) Field of Classification Search
CPC . H01L 43/08; H01L 21/0332; H01L 21/0335; H01L 21/0337; H01L 21/0338; H01L 21/76811; H01L 21/32; G11C 2211/5615; G11C 11/161
See application file for complete search history.

(56) References Cited

U.S. PATENT DOCUMENTS

| | | | | |
|---|---|---|---|---|
| 8,420,408 B2* | 4/2013 | Lee | .......................... | H01L 43/12 438/3 |
| 8,747,680 B1* | 6/2014 | Deshpande | .............. | G11B 5/84 216/22 |
| 8,975,088 B2* | 3/2015 | Satoh | ...................... | H01L 29/00 438/3 |
| 9,543,502 B2 | 1/2017 | Zou et al. | | |
| 9,722,174 B1 | 8/2017 | Nagel et al. | | |
| 10,008,662 B2* | 6/2018 | You | .......................... | H01L 43/12 |
| 2009/0130779 A1* | 5/2009 | Li | .......................... | H01L 43/12 438/3 |

(Continued)

*Primary Examiner* — Christine A Enad
(74) *Attorney, Agent, or Firm* — Haynes and Boone, LLP

(57) ABSTRACT

A method for etching a magnetic tunneling junction (MTJ) structure is described. A stack of MTJ layers on a bottom electrode on a wafer is provided. A metal hard mask layer is provided on the MTJ stack. A stack of multiple dielectric hard masks is formed on the metal hard mask wherein each successive dielectric hard mask has etch selectivity with respect to its underlying and overlying layers. The dielectric hard mask layers are etched in turn selectively with respect to their underlying and overlying layers wherein each successive pattern size is smaller than the preceding pattern size. The MTJ stack is etched selectively with respect to the bottommost combination dielectric and metal hard mask pattern to form a MTJ device having a MTJ pattern size smaller than a bottommost pattern size.

20 Claims, 3 Drawing Sheets

(56) References Cited

U.S. PATENT DOCUMENTS

| | | | | |
|---|---|---|---|---|
| 2010/0240151 A1* | 9/2010 | Belen | ............... | H01L 43/12 438/3 |
| 2010/0327248 A1* | 12/2010 | Khoueir | ............... | H01L 43/12 257/2 |
| 2015/0236248 A1* | 8/2015 | Deshpande | ............ | H01L 43/12 438/3 |

* cited by examiner

US 10,446,741 B2

MULTIPLE HARD MASK PATTERNING TO FABRICATE 20NM AND BELOW MRAM DEVICES

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define those millions of magnetic tunnel junction (MTJ) cells in each MRAM device and make them non-interacting to each other, precise patterning steps including photolithography and reactive ion etching (RIE), ion beam etching (IBE) or their combination are usually involved. During photolithography, patterns are transferred from a photomask to a light-sensitive photoresist and later transferred to MTJ stacks by RIE, IBE or their combination, forming separate and non-interacting MTJ devices. Therefore the MTJ cell size is generally determined by the photoresist pattern size. To fabricate future sub-nano node products with ultra-small device size, various complex and expensive photolithography systems such as immersion deep ultraviolet (DUV) and extreme ultraviolet (EUV) are needed. A simple low cost alternative solution would be preferred.

Several patents teach using more than one hard mask. U.S. Patent Application 2010/0327248 (Khoueir et al) and U.S. Pat. No. 9,543,502 (Zou et al) and U.S. Pat. No. 9,722,174 (Nagel et al). All of these references are different from the present disclosure.

SUMMARY

It is an object of the present disclosure to provide an improved method of forming MTJ structures.

Yet another object of the present disclosure is to provide a method of forming MTJ structures much smaller than photoresist pattern size.

A further object is to provide a method of optimizing plasma etch conditions during the patterning of multiple hard masks, gradually reducing hard mask size, resulting in a much reduced MTJ device size.

A still further object is to provide an optimized multiple hard mask process eventually decreasing the initial photoresist pattern size of ~80 nm to a final MTJ device size of 20 nm and below.

In accordance with the objectives of the present disclosure, a method for etching a magnetic tunneling junction (MTJ) structure is achieved. A stack of MTJ layers on a bottom electrode on a wafer is provided. A metal hard mask layer is provided on the MTJ stack. A stack of multiple dielectric hard masks is formed on the metal hard mask wherein each successive dielectric hard mask has etch selectivity with respect to its underlying and overlying layers. The dielectric hard mask layers are etched in turn selectively with respect to their underlying and overlying layers wherein each successive pattern size is smaller than the preceding pattern size. The MTJ stack is etched selectively with respect to the bottommost combined dielectric and metal hard mask pattern to form a MTJ device having a MTJ pattern size smaller than a bottommost pattern size.

BRIEF DESCRIPTION OF THE DRAWINGS

In the accompanying drawings forming a material part of this description, there is shown.

DETAILED DESCRIPTION

In the present disclosure, we introduce a series of plasma etch approaches that can reduce their corresponding hard mask pattern size. Starting with a photoresist pattern size of ~80 nm, the hard mask is gradually reduced to ~50 nm, ~40 nm and ~30 nm at sequential steps, eventually allowing for a MTJ device size smaller than 20 nm after the final MTJ etch. This process is a simple, low cost approach to fabricate future sub 20 nm MTJ devices without involving high cost, complex exposure systems with ultra-small wavelength.

Typically, patterns are transferred from photoresist to metal hard mask, and then to MTJ. Thus, the minimal MTJ pattern size is defined by the minimal metal hard mask size, which is decided by the minimal photoresist pattern size, i.e., ~70 nm using a 248 nm wavelength photolithography tool. In the process of the present disclosure, we insert multiple hard masks consisting of (from bottom to top) SiON/spin-on carbon (SOC)/Si hard mask (Si HM) above the metal hard mask and underneath the photoresist. By optimizing their plasma etch conditions, we can decrease Si HM pattern size to ~50 nm, SOC to ~40 nm, SiON and metal hard mask to ~30 nm and final MTJ device size to 20 nm or below. The high etch selectivity among each hard mask layer also allows for high pattern integrity and reduces the device non-uniformity.

Figure 1:
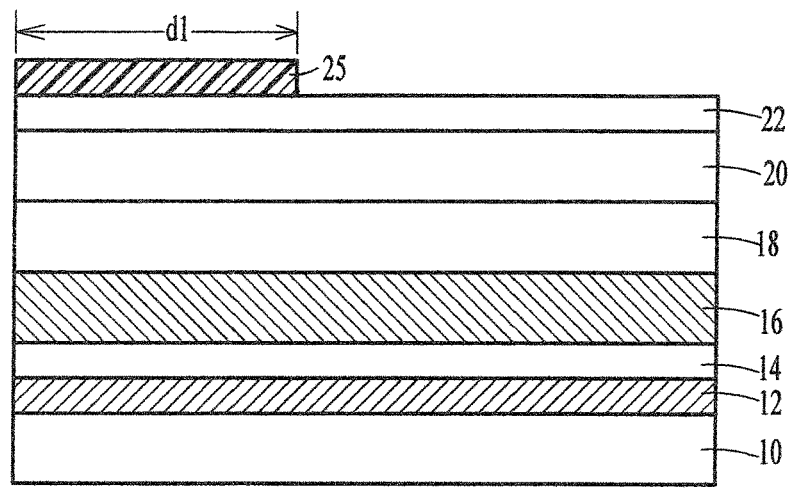
FIGS. 1 through 6 illustrate in cross-sectional representation steps in a preferred embodiment of the present disclosure.

The schematic process flow of a 20 nm or below MTJ cell created by multiple hard mask etching is shown in FIGS. 1-6. FIG. 1 illustrates a bottom electrode layer 12 formed on a semiconductor substrate 10. Next, the MTJ film layers are deposited, typically including a seed layer, a pinned layer, a barrier layer, a free layer, and a cap layer, for example. These layers form the MTJ film stack 14.

On top of MTJ stack 14, a metal hard mask 16 such as Ta, Ti, TaN or TiN is deposited, preferably to a thickness of between about 30 and 100 nm. Then, multiple dielectric hard masks are deposited on the metal hard mask sequentially. First dielectric hard mask 18 may comprise silicon oxynitride (SiON), silicon oxide, or silicon nitride (SiN), having a thickness of between about 10 and 1000 nm. Second dielectric hard mask 20 may comprise spin-on carbon (SOC) or physically or chemically deposited amorphous carbon, having a thickness of between about 100 and 500 nm. Third dielectric hard mask 22 may comprise Silicon (Si), SiON, or SiN, having a thickness of between about 10 and 50 nm. Each dielectric hard mask is etch selective with respect to its overlying and underlying layers.

Figure 2:
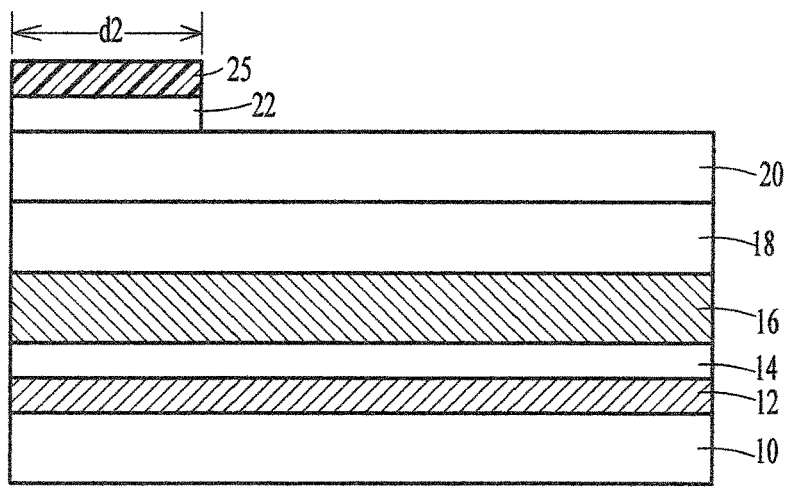

Finally, a photoresist layer is coated on top of the hard mask stack. During photolithography with a typical 248 nm wavelength light source, a photoresist pattern 25 size d1 (~80 nm) is formed as shown in FIG. 1. Now, the Si hard mask 22 is etched in a reactive ion etching (RIE) step by a plasma using a fluorine-based gas such as $CF_4$ or $CHF_3$ mixed with $O_2$. Fluorine gas is the main gas that readily etches the Si hard mask (HM), but it has a lower etch rate on carbon based photoresist and SOC, above and underneath the Si HM, respectively, allowing for a good selectivity and high pattern quality. $O_2$ is added to remove any polymer residues during the reaction and thus greatly reduces the pattern size to d2 (~45-50 nm) as shown in FIG. 2.

Figure 3:
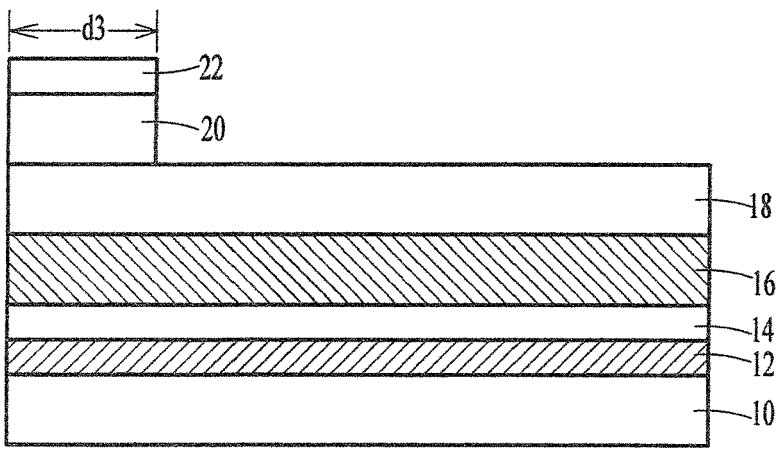

During the next step, pure $O_2$ or $O_2$ mixed with a halogen such as $Cl_2$ or HBr is used to isotropically etch the SOC hard mask 20, reducing the pattern size to d3 (~40 nm) as shown in FIG. 3. This $O_2$ based plasma has a very low etch rate on Si HM above and SiON underneath, again allowing for a high quality pattern. The photoresist mask 25 is removed during this etch step.

Figure 4:
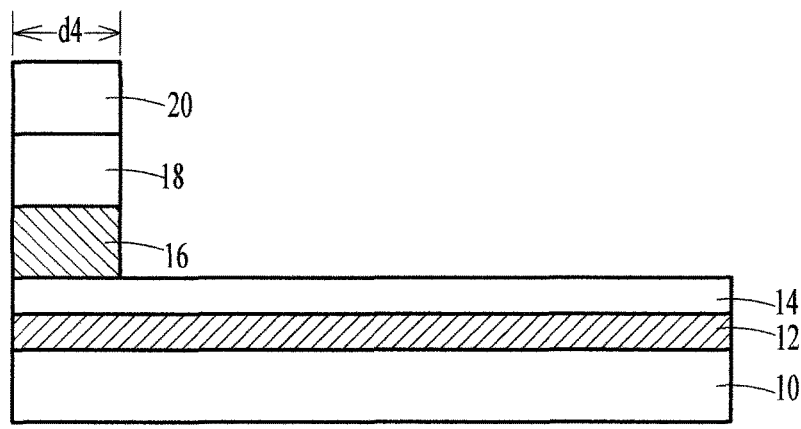
Figure 5:
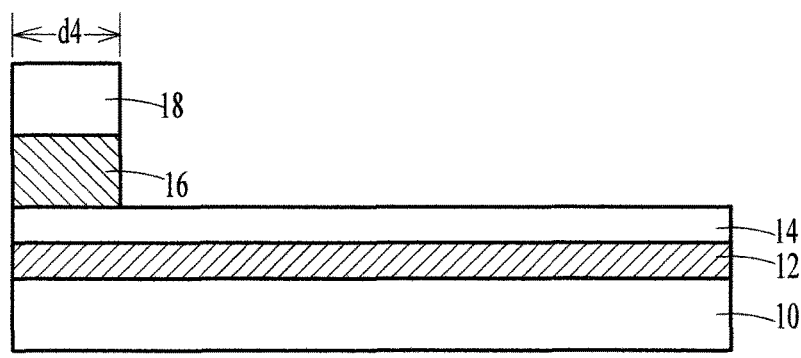

For the next step of SiON and metal hard mask etch, a fluorine based plasma is again used. This plasma readily etches SiON 18 and metal 16, but not SOC 20 above and MTJ 14 underneath. By utilizing a high source power and low bias power, an isotropic chemical etch is again used and reduces the pattern size to d4 (~30 nm) as shown in FIG. 4. A fluorine-based gas such as $CF_4$ or $CHF_3$ is mixed with $O_2$. A high source power of between about 300 and 1000 watts and a low bias power of between about 20 and 100 W is applied. Alternatively, prior to the last step of MTJ etch, any remaining SOC 20 on top is stripped away by $O_2$, $H_2O$ vapor or their mixture, keeping the pattern size the same, as shown in FIG. 5.

Figure 6:
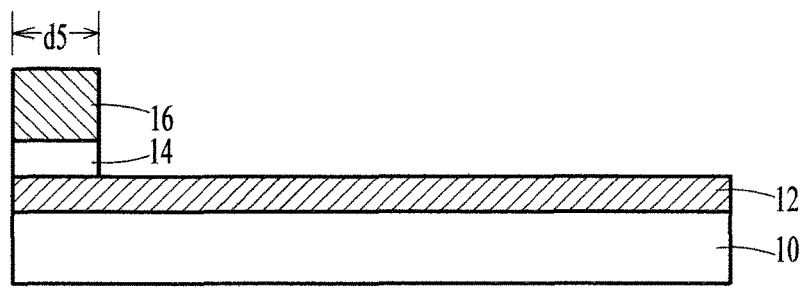

Lastly, a plasma species with high source power and low bias power, such as $CH_3OH$ or $CH_3OH$ mixed with Ar is used to isotropically etch the MTJ. A high source power of between about 1000 and 3000 W and a low bias power of between about 100 and 1000 W is applied. These gases and etch conditions are used because the magnetic materials within the MTJ stack can be readily etched away and reduce the pattern size to d5 (~20 nm), as shown in FIG. 6.

Figure 7:
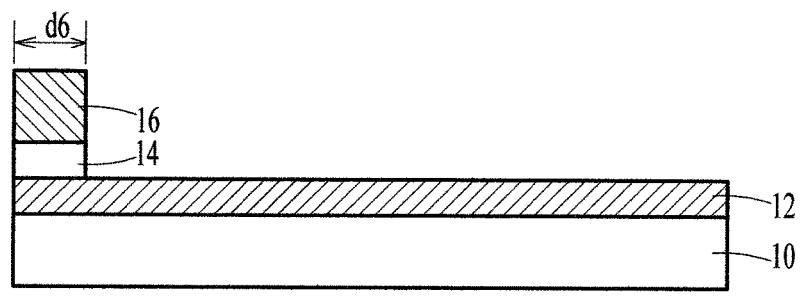
FIG. 7 illustrates in cross-sectional representation an optional additional step in a preferred embodiment of the present disclosure.

In an optional additional step, as shown in FIG. 7, after the $CH_3OH$ or $CH_3OH$/Ar RIE etch, ion beam etching (IBE) using Ar plasma with a RF power of between about 500 to 1000 W is applied to the MTJ sidewalls to remove any damage and metal re-deposition from the previous RIE step. This further decreases the MTJ size to d6 (~15 nm).

Figure 8:
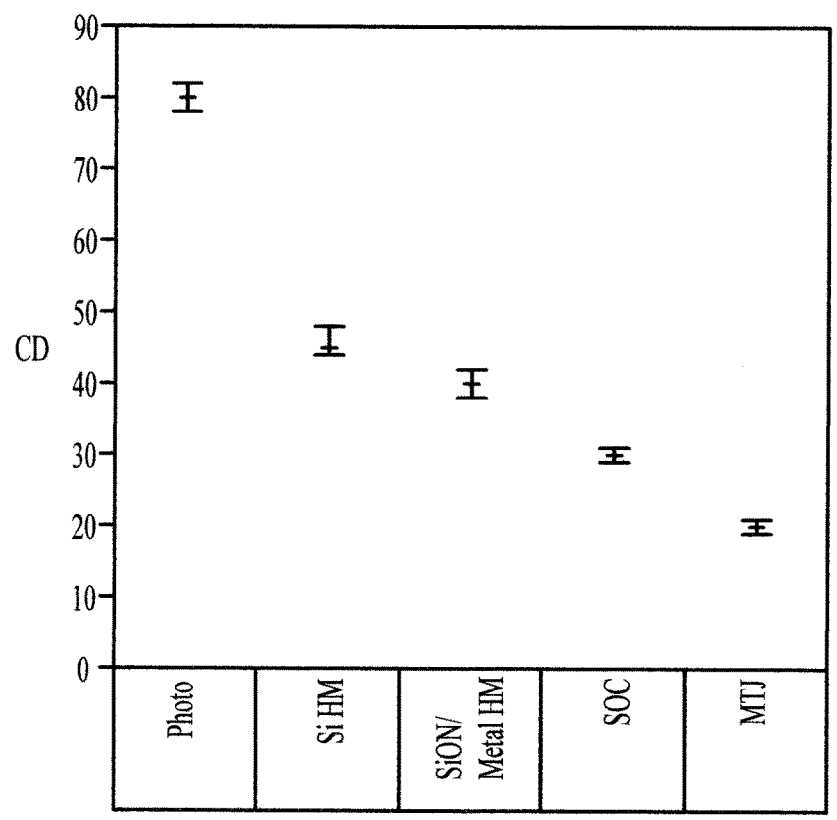
FIG. 8 is a graphical representation of the overall decrease in pattern size from initial photoresist to multiple hard masks and final MTJ device in a preferred embodiment of the present disclosure.

Scanning Electron Microscope (SEM) images confirm the decrease in pattern size over the process steps. FIG. 8 graphically illustrates the overall decrease in pattern size for the hard mask materials.

The process of the present disclosure creates sub 20 nm MTJ cell size by reducing the multiple hard masks' sizes during plasma etch. The multiple hard masks also allow for a better selectivity during etch, thus resulting in a higher device size and performance uniformity. Compared to the complex and expensive immersion 193 nm photolithography instruments with optical proximity correction (OPC) that people are using to deliver the same results, this is a much simpler and lower cost approach.

This process can be used especially for MRAM chips of the size smaller than 60 nm, which requires smaller critical dimension (CD) and higher device uniformity. Multiple hard masks are used to pattern the MTJ cells, by RIE alone or combined with IBE. The pattern size of each layer of hard mask is reduced by optimizing the plasma etch conditions to form an isotropic etch. The MTJ is isotropically etched by RIE, IBE or their combination, eventually reducing the pattern size to 20 nm and below. Due to the high selectivity, the integrity of patterns is preserved, leading to improved MTJ size uniformity.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising:
   providing a MTJ stack on a substrate;
   depositing a metal hard mask layer on said MTJ stack;
   depositing a first dielectric hard mask on said metal hard mask;
   depositing a second dielectric hard mask on said first dielectric hard mask;
   depositing a third dielectric hard mask on said second dielectric hard mask;
   forming a photoresist pattern on said third dielectric hard mask wherein said photo resist pattern has a first pattern size;
   etching said third dielectric hard mask selectively with respect to said photoresist pattern and said second dielectric hard mask to form a third dielectric hard mask pattern having a second pattern size smaller than said first pattern size;
   thereafter etching said second dielectric hard mask selectively with respect to said third dielectric hard mask pattern and said first dielectric hard mask to form a second dielectric hard mask pattern having a third pattern size smaller than said second pattern size;
   thereafter etching said first dielectric hard mask and said metal hard mask selectively with respect to said second dielectric hard mask pattern and said MTJ stack to form a first dielectric hard mask pattern having a fourth pattern size smaller than said third pattern size; and
   thereafter etching said MTJ stack selectively with respect to said first dielectric hard mask pattern to form a MTJ device having a fifth pattern size smaller than said fourth pattern size.

2. The method according to claim 1 wherein said metal hard mask comprises one of the group containing Ta, Ti, TaN, and TiN having a thickness of between about 30 and 100 nm.

3. The method according to claim 1 wherein said first dielectric hard mask comprises silicon oxynitride (SiON), silicon oxide, or silicon nitride having a thickness of between about 10 and 1000 nm.

4. The method according to claim 1 wherein said second dielectric hard mask comprises spin-on carbon (SOC) or physically or chemically deposited amorphous carbon having a thickness of between about 100 and 500 nm.

5. The method according to claim 1 wherein said third dielectric hard mask comprises silicon or silicon oxynitride having a thickness of between about 10 and 50 nm.

6. The method according to claim 1 wherein said etching said third dielectric hard mask comprises etching with a plasma using a fluorine-based gas comprising $CF_4$ or $CHF_3$ said fluorine-based gas being mixed with $O^2$.

7. The method according to claim 1 wherein said etching said second dielectric hard mask comprises isotropically etching with pure $O_2$ or $O_2$ mixed with a halogen comprising $Cl_2$ or HBr.

8. The method according to claim 1 wherein said etching said first dielectric hard mask and said metal hard mask comprises etching with a plasma using a fluorine-based gas comprising $CF_4$ or $CHF_3$ said fluorine-based gas being mixed with $O_2$ under a high source power and low bias power.

9. The method according to claim 1 wherein said etching said MTJ stack comprises isotropically etching with high source power and low bias power and with a plasma species comprising $CH_3OH$ or $CH_3OH$, said plasma species mixed with Ar.

10. The method according to claim 9 after etching said MTJ stack, further comprising etching sidewalls of said MTJ stack with an ion beam etch using Ar plasma with a RF power of between about 500 to 1000 W to remove any damage and metal re-deposition from said MTJ sidewalls wherein said MTJ stack has a sixth pattern size smaller than said fifth pattern size and wherein said sixth pattern size is about 15 nm.

11. The method according to claim 1 wherein said first pattern size is between about 70 and 80 nm, said second pattern size is between about 45 and 50 nm, said third pattern size is between about 30 and 40 nm, said fourth pattern size is between about 20 and 30 nm, and said fifth pattern size is between about 15 and 20 nm.

12. The method according to claim 1 wherein said second dielectric hard mask remaining is stripped away by $O_2$, $H_2O$ vapor or their mixture prior to said etching said MTJ stack.

13. A method for etching a magnetic tunneling junction (MTJ) structure comprising:
    providing a MTJ stack on a substrate;
    depositing a metal hard mask layer on said MTJ stack;
    depositing a first silicon-based hard mask on said metal hard mask;
    depositing a second carbon-based hard mask on said first hard mask;
    depositing a third silicon-based hard mask on said second hard mask;
    forming a photo resist pattern on said third hard mask wherein said photo resist pattern has a first pattern size;
    etching said third hard mask selectively with respect to said photo resist pattern and said second hard mask to form a third hard mask pattern having a second pattern size smaller than said first pattern size;
    thereafter etching said second hard mask selectively with respect to said third hard mask pattern and said first hard mask to form a second hard mask pattern having a third pattern size smaller than said second pattern size;
    thereafter etching said first hard mask and said metal hard mask selectively with respect to said second hard mask pattern and said MTJ stack to form a first hard mask pattern having a fourth pattern size smaller than said third pattern size; and
    thereafter etching said MTJ stack selectively with respect to said first hard mask pattern to form a MTJ device having a fifth pattern size smaller than said fourth pattern size.

14. The method according to claim 13 wherein said metal hard mask comprises one of the group containing Ta, Ti, TaN, and TiN, said first silicon-based hard mask comprises silicon oxynitride (SiON), silicon oxide, or silicon nitride, said second carbon-based hard mask comprises spin-on carbon (SOC) or amorphous carbon, and said third silicon-based hard mask comprises silicon or silicon oxynitride.

15. The method according to claim 13 wherein:
    said etching said third silicon-based hard mask comprises etching with a plasma using a fluorine-based gas comprising $CF_4$ or $CHF_3$ said fluorine-based gas being mixed with $O_2$;
    said etching said second carbon-based hard mask comprises isotropically etching with pure $O_2$ or $O_2$ mixed with a halogen comprising $Cl_2$ or HBr;
    said etching said first silicon-based hard mask and metal hard mask comprises etching with a plasma using a fluorine-based gas comprising $CF_4$ or $CHF_3$ said fluorine-based gas being mixed with $O_2$ under a high source power and low bias power; and
    said etching said MTJ stack comprises isotropically etching with high source power and low bias power and with a plasma species comprising $CH_3OH$ or $CH_3OH$, said plasma species mixed with Ar.

16. The method according to claim 15 after etching said MTJ stack, further comprising etching sidewalls of said MTJ stack with an ion beam etch using Ar plasma with a RF power of between about 500 to 1000 W to remove any damage and metal re-deposition from said MTJ sidewalls wherein said MTJ stack has a sixth pattern size smaller than said fifth pattern size and wherein said sixth pattern size is about 15 nm.

17. The method according to claim 13 wherein said first pattern size is between about 70 and 80 nm, said second pattern size is between about 45 and 50 nm, said third pattern size is between about 30 and 40 nm, said fourth pattern size is between about 20 and 30 nm, and said fifth pattern size is between about 15 and 20 nm.

18. A method comprising:
    forming a magnetic tunneling junction (MTJ) stack on a substrate;
    forming a first hard mask layer on the MTJ stack;
    forming a second hard mask layer on the first hard mask layer, the second hard mask layer formed of a different material than the first hard mask layer;
    forming a third hard mask layer on the second hard mask layer, the third hard mask layer formed of a different material than the second hard mask layer;
    forming a fourth hard mask layer on the third hard mask layer, the fourth hard mask layer formed of a different material than the third hard mask layer;
    patterning the fourth hard mask layer such that the patterned fourth hard mask layer has a first pattern size;
    patterning the third hard mask layer by using the patterned fourth hard mask layer as a mask, the patterned third hard mask layer having a second pattern size that is smaller than the first pattern size;
    patterning the second hard mask layer by using the patterned third hard mask layer as a mask, the patterned second hard mask layer having a third pattern size that is smaller than the second pattern size;
    patterning the first hard mask layer by using the patterned second hard mask layer as a mask, the patterned first hard mask layer having a fourth pattern size that is smaller than the third pattern size; and
    patterning the MTJ stack by using the patterned first hard mask layer as a mask, the patterned MTJ stack having a fifth pattern size that is smaller than the fourth pattern size.

19. The method of claim 18, wherein the first hard mask layer is formed of a metal material,
    wherein the second hard mask layer is formed of a first dielectric material, and wherein the third hard mask layer is formed of a second dielectric material.

20. The method of claim 18, further comprising performing an ion beam etching process on the patterned MTJ stack to reduce the fifth pattern size to a sixth pattern size, the sixth pattern size being less than the fifth pattern size.

\* \* \* \* \*